US011360539B2

(12) United States Patent
Hu et al.

(10) Patent No.: US 11,360,539 B2
(45) Date of Patent: Jun. 14, 2022

(54) ADAPTIVE CLOCK SIGNAL FREQUENCY SCALING

(71) Applicant: MaxLinear, Inc., Carlsbad, CA (US)

(72) Inventors: Chunfeng Hu, Singapore (SG); Rajan Raghvendra, Singapore (SG)

(73) Assignee: MaxLinear, Inc., Carlsbad, CA (US)

( * ) Notice: Subject to any disclaimer, the term of this patent is extended or adjusted under 35 U.S.C. 154(b) by 758 days.

(21) Appl. No.: 16/134,174

(22) Filed: Sep. 18, 2018

(65) Prior Publication Data

US 2019/0041945 A1 Feb. 7, 2019

(51) Int. Cl.
*G06F 1/00* (2006.01)
*G06F 1/324* (2019.01)
*H03K 5/135* (2006.01)
*G06F 1/08* (2006.01)
*G06F 1/3203* (2019.01)

(52) U.S. Cl.
CPC .............. *G06F 1/324* (2013.01); *G06F 1/08* (2013.01); *H03K 5/135* (2013.01); *G06F 1/3203* (2013.01)

(58) Field of Classification Search
CPC ............ G06F 1/324; G06F 1/08; H03K 5/135
USPC ......................................................... 713/322
See application file for complete search history.

(56) References Cited

U.S. PATENT DOCUMENTS

| | | | | |
|---|---|---|---|---|
| 7,852,109 B1* | 12/2010 | Chan | ................ | H03K 19/17764 326/16 |
| 9,081,517 B2* | 7/2015 | Koniaris | ............... | G06F 1/3237 |
| 10,187,045 B2* | 1/2019 | Zyuban | .................. | H03K 5/131 |
| 10,503,202 B1* | 12/2019 | Brown | ....................... | H03L 7/18 |
| 10,732,697 B2* | 8/2020 | Srinivas | ................ | G06F 1/3275 |
| 2003/0042506 A1* | 3/2003 | Kellgren | .................. | G06F 1/08 257/200 |
| 2007/0276891 A1* | 11/2007 | Warner | ................... | G06F 1/025 708/277 |
| 2008/0297202 A1* | 12/2008 | Takita | ...................... | H03L 7/08 327/42 |
| 2010/0162063 A1* | 6/2010 | Teyssier | ............... | G06F 1/3203 714/735 |
| 2011/0271134 A1* | 11/2011 | Hofmann | .............. | G06F 1/3237 713/500 |
| 2012/0326760 A1* | 12/2012 | Kesselring | ............. | H03K 3/017 327/175 |
| 2014/0040647 A1* | 2/2014 | Bridges | ................. | G06F 1/3296 713/322 |
| 2014/0232474 A1* | 8/2014 | Walters | .................... | H03K 3/72 331/25 |

(Continued)

*Primary Examiner* — Volvick Derose
(74) *Attorney, Agent, or Firm* — Buchalter; Jason W. Croft

(57) ABSTRACT

Systems, methods, and circuitries are disclosed generating a dynamic clock signal having a dynamic clock signal frequency for a data processing system from an input clock signal having an input clock signal frequency. In one example, adaptive frequency scaling circuitry includes scaling control circuitry and clock gating circuitry. The scaling control circuitry includes hardware configured to receive a performance indicator value indicative of an operating parameter of the data processing system and select a dynamic clock gating control value based at least on the performance indicator value. The clock gating circuitry is configured to receive the dynamic clock gating control value, and in response, selectively gate the input clock signal based on the dynamic clock gating control value to generate the dynamic clock signal.

17 Claims, 5 Drawing Sheets

(56) References Cited

U.S. PATENT DOCUMENTS

| | | | |
|---|---|---|---|
| 2015/0146818 A1* | 5/2015 | Kim | H04B 5/0031 375/295 |
| 2015/0207510 A1* | 7/2015 | Pace | H03K 21/10 377/47 |
| 2018/0364781 A1* | 12/2018 | Schreiber | G06F 1/3296 |
| 2019/0027109 A1* | 1/2019 | Lee | G09G 3/3688 |

* cited by examiner

ADAPTIVE CLOCK SIGNAL FREQUENCY SCALING

BACKGROUND

Power optimization has become an important goal in integrated circuit design as integrated circuits are called upon to provide increasing functionality as the electronic devices that include the integrated circuits shrink in physical size. Clock tree power consumes up to 70% of total integrated circuit power and modern integrated circuit designs at 40 nm and below experience significantly increased clock tree power consumption. Power consumption is directly proportional to the voltage and frequency of the clock tree.

DESCRIPTION

Figure 1:
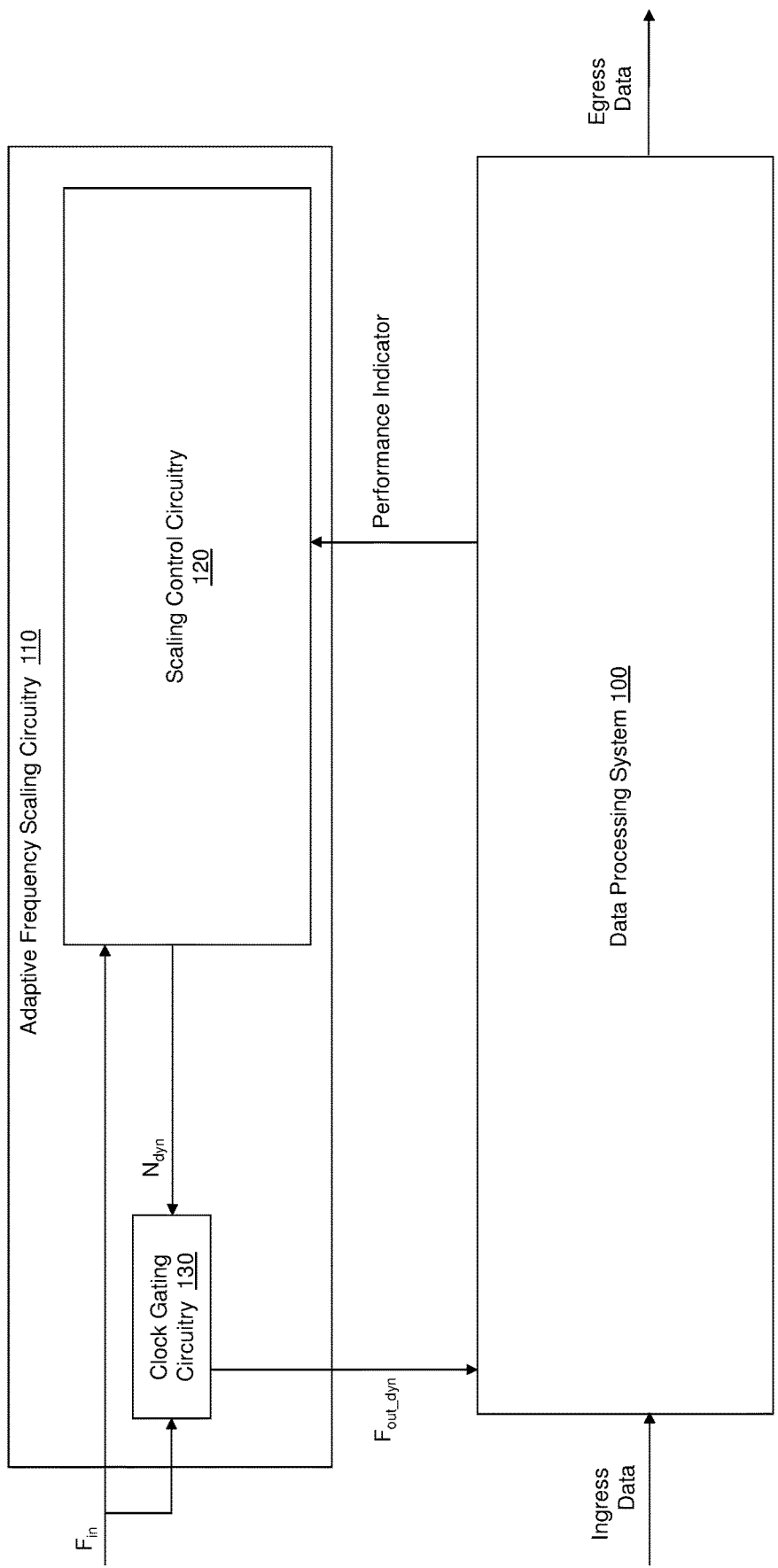
FIG. 1 illustrates an exemplary adaptive frequency scaling circuitry generating a dynamic clock signal from an input clock signal for a data processing system in accordance with various aspects described.

Because power consumption is directly related to clock signal frequency, many devices include means for reducing clock signal frequency when operating conditions of the device allow for satisfactory device performance at the reduced clock signal frequency. In many existing solutions, software is used to adjust the clock signal frequency according to the activity level of hardware components in the device. However, software-based control of clock signal frequency has a slow response time and may result in a drop in performance (e.g., packet loss in a networking device) in fast changing scenarios. Another disadvantage is that these solutions often rely on multiple phase locked loops (PLLs) to generate clock signals with different frequencies or divider circuits that can generate clocks signals with frequencies that are an integer fractions (e.g., ½, ⅓, ..., and so on) of the original clock signal frequency.

Described herein are systems, circuitries, and methods that adaptively and dynamically generate a clock signal having a dynamic clock signal frequency that is determined based on operating conditions. The described adaptive clock signal generation systems, circuitries, and methods are hardware based rather than software based, meaning that the response time can be immediate (i.e., a single input clock signal cycle). Further, only a single PLL is needed and clock signal frequencies can be generated with a much finer granularity as compared to simple divider-based solutions.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates a data processing system 100 that receives a dynamic clock signal having a frequency $F_{out\_dyn}$ from an exemplary adaptive frequency scaling circuitry 110. The data processing system 100 includes digital electronic components such as integrated circuits (not shown) that input and operate according to the dynamic clock signal. In some of the examples below, the data processing system 105 is a network processing system. However, the data processing system can be any system that includes components clocked by the dynamic clock signal and that receives ingress data, manipulates the data, and produces egress data.

The adaptive frequency scaling circuitry 110 generates the dynamic clock signal from an input clock signal having a frequency $F_{in}$. The adaptive frequency scaling circuitry 110 includes scaling control circuitry 120 and clock gating circuitry 130. The scaling control circuitry 120 includes hardware configured to receive a performance indicator value indicative of an operating parameter of the data processing system. The operating parameter is some characteristic of the data processing system (e.g., number of active links, buffer usage, and so on) that can be used to determine an appropriate clock signal frequency. The scaling control circuitry 120 hardware selects a dynamic clock gating control value $N_{dyn}$ based at least on the performance indicator value, where N is an integer. The clock gating circuitry 130 receives the dynamic clock gating control value and, in response, selectively gates the input clock signal based on the dynamic clock gating control value to generate the dynamic clock signal.

Figure 2:
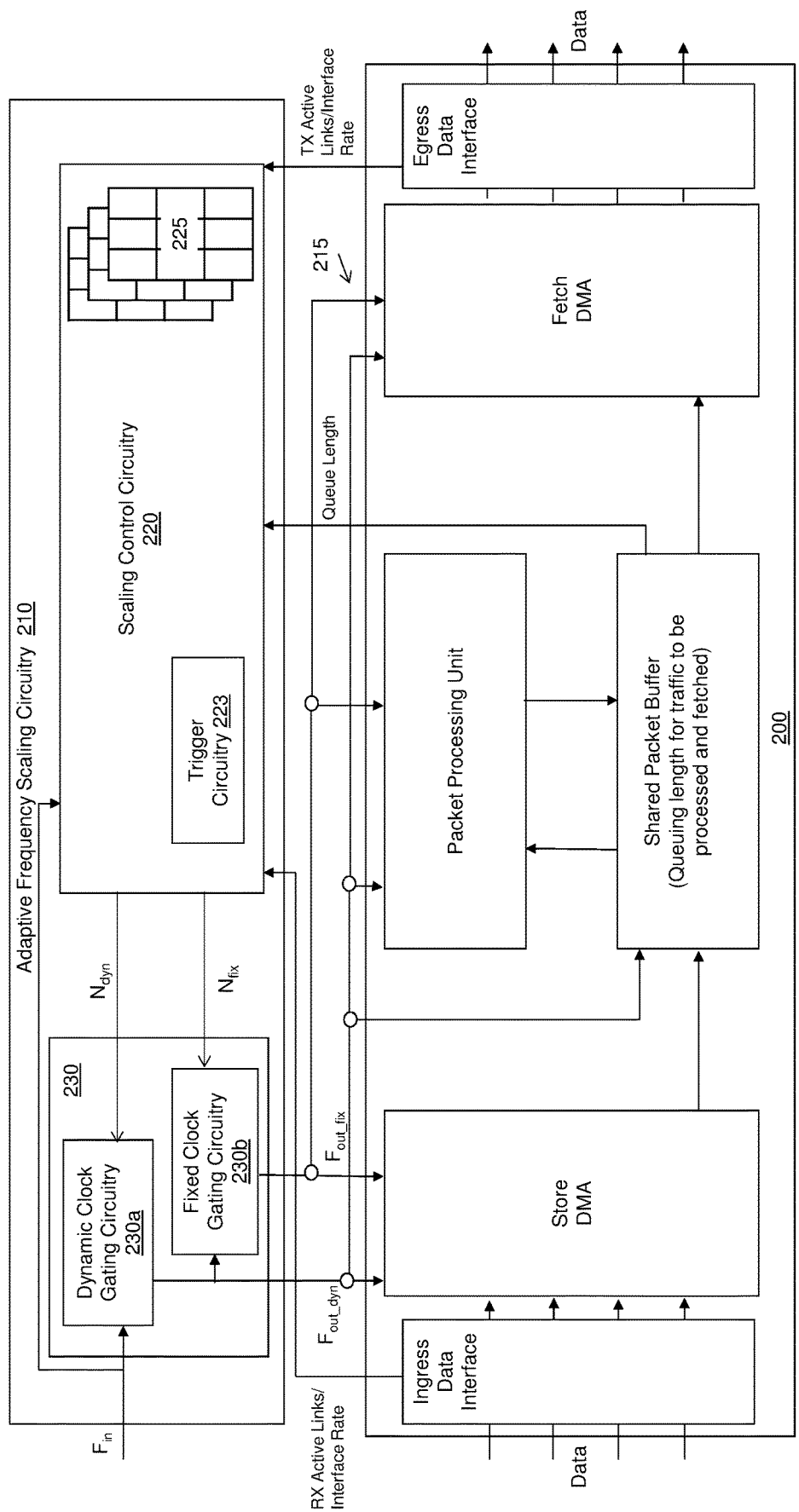
FIG. 2 illustrates an exemplary adaptive frequency scaling circuitry generating a dynamic clock signal and a fixed clock signal from an input clock signal for a data processing system in accordance with various aspects described.

FIG. 2 illustrates an exemplary adaptive frequency scaling circuitry 210 that generates a dynamic clock signal and a fixed clock signal for a network processing system 200. The network processing system 200 includes an ingress data interface that receives packets from external components and an egress interface that transmits packets to external components. A store direct memory access (DMA) receives packets from the ingress data interface and stores the packets to shared packet buffer. The shared packet buffer stores and queues the packets to be processed and to be fetched. A packet processing unit reads full or partial packets and classifies the packets. The packet processing unit may also modify packets in the shared packet buffer. A fetch DMA fetches the packets from the shared packet buffer and transmits the packets to an egress data interface.

The various functional components of the network processing system 100 are implemented with several ICs (shown as the boxes). The distribution of the functional components of the network processing system amongst ICs may be different that that shown in FIG. 2 in other examples (i.e., some functional components may be provided on the same IC while other functional components are distributed amongst several ICs). Some electronic components in a given IC may require a fixed clock frequency while other components may be capable of operating at different clock frequencies. Because of this, the adaptive frequency scaling circuitry 210 generates a dynamic clock signal having a dynamic clock frequency that changes according to the performance indicator value and a fixed clock signal that has a constant clock frequency regardless of the performance indicator value. For the purposes of this description, the dynamic clock signal has a dynamic clock frequency that is changed by adaptive frequency scaling circuitry according to operating conditions of the data processing system, while the fixed clock signal has a fixed clock frequency that remain constant to provide an unchanging clock signal for IC components that require a constant clock. The scaling control circuitry 220 generates a dynamic clock gating control value $N_{dyn}$ based on the performance indicator value. The scaling control circuitry 220 generates a fixed clock gating signal $N_{fix}$ that will result in the frequency of the fixed clock signal remaining the same regardless of the performance indicator value.

The adaptive frequency scaling circuitry 210 includes a dynamic clock gating circuitry 230a that generates the dynamic clock signal and a fixed clock gating circuitry 230b that generates the fixed clock signal. As will be described in more detail with reference to FIG. 3, the dynamic clock gating circuitry 230a selectively gates the input clock signal based on the dynamic clock gating control value to generate the dynamic clock signal. The fixed clock gating circuitry 230b selectively gates the dynamic clock signal based on the fixed clock gating control value to generate the fixed clock signal. The fixed clock gating circuitry 230b gates the dynamic clock signal, rather than the input clock signal, so that the dynamic clock signal and fixed clock signal remain in synchronization. Both clock signals are provided by way of a clock tree 215 to the ICs in the network processing system.

The scaling control circuitry 220 determines the clock gating control value for each clock gating circuitry based on performance indicators that include the link rate of the ingress interface and the egress interface, the link activity of the ingress interface and the egress interface, and one or several queue lengths in the shared packet buffer. Of course, in other examples different or additional performance indicators are used. As will be described in more detail with reference to FIG. 4, the scaling control circuitry 220 includes pre-configured lookup tables that each map dynamic clock gating control values and fixed clock gating control values to values for one of the performance indicators.

In some examples, the scaling control circuitry 220 includes trigger circuitry 223 that causes the scaling control circuitry to generate new clock gating control values based on the current value of the performance indicator. For example, the trigger circuitry 223 may be configured to count a predetermined integer number x of input clock cycles and cause the scaling control circuitry 220 to generate new clock gating control values on every xth input clock cycle. In other examples, the trigger circuitry 223 be configured to detect a change in the performance indicator value and cause the scaling circuitry to generate new clock gating control values when a performance indicator value change of a given significance occurs. In another example, the hardware of the scaling control circuitry 220 is clocked by the input clock signal and the clock gating control values are generated every cycle of the input clock signal.

Figure 3:
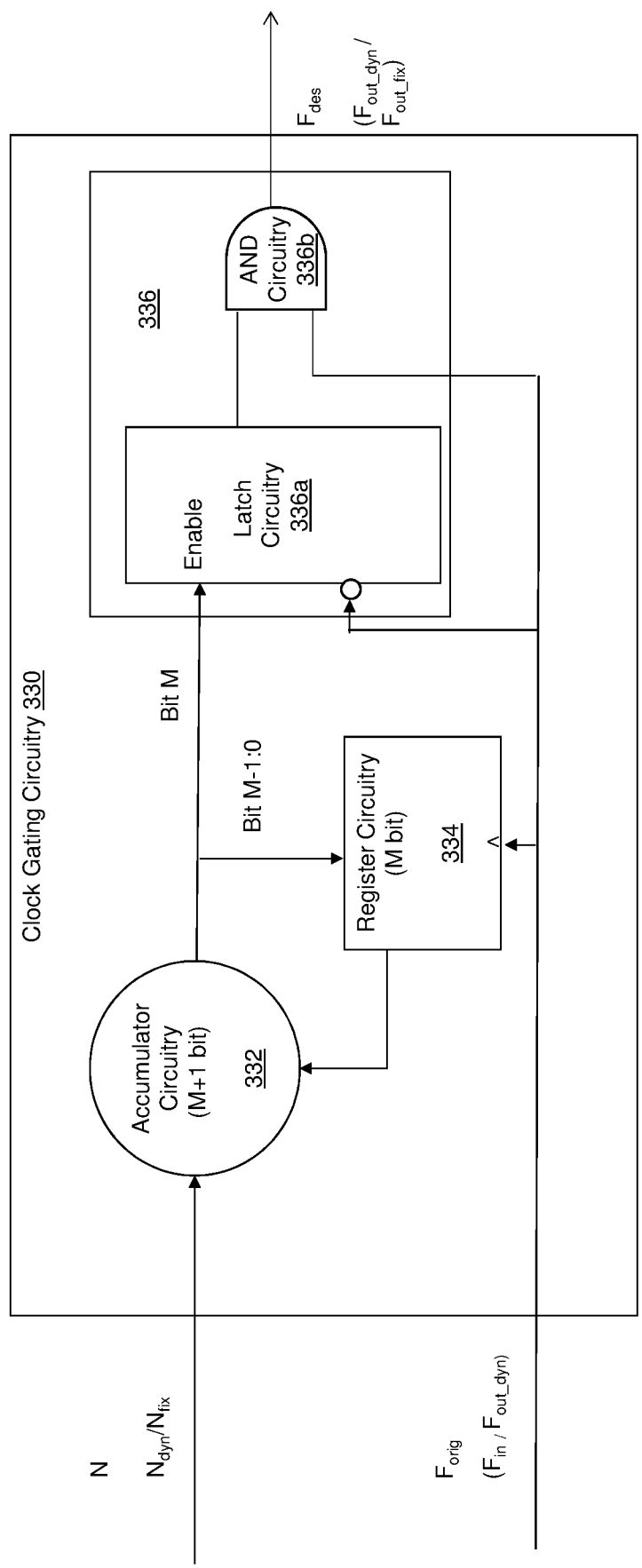
FIG. 3 illustrates an exemplary clock gating circuitry for use in generating the dynamic clock signal in accordance with various aspects described.

FIG. 3 illustrates an exemplary M bit clock gating circuitry 330 that scales an original clock frequency $F_{orig}$ (which can be either the input clock frequency $F_{in}$ or the dynamic clock frequency $F_{out\_dyn}$) to a desired clock frequency $F_{des}$. Over every $2^M$ original clock signal cycles, the clock gating circuitry passes N original clock signal pulses of the original clock signal to generate a desired (e.g., dynamic or fixed) clock signal having the desired clock frequency.

The clock gating circuitry 330 includes accumulator circuitry 332, register circuitry 334, and gate circuitry 336. The accumulator circuitry 332 has M+1 bits with the most significant bit (MSB) M being an overflow bit. On every original clock signal cycle, the accumulator circuitry 332 receives M+1 bits corresponding to the value of N by way of a first input and M bits from the register circuitry 334 by way of a second input. The register circuitry 334 stores the values of the M−1:0 bits of the accumulator circuitry 332 in the prior clock cycle. Thus, with every cycle of the original clock signal, the content of accumulator circuitry 332 is increased by N. The gate circuitry 336 includes latch circuitry 336a and AND circuitry 336b. The latch circuitry 336a stores a value of 1 for every 0 value in the original clock signal. The MSB (bit M) of the accumulator is the clock enable of the latch circuitry 336a that causes the latch circuitry 336a to output the stored 1 value. The AND circuitry 336b outputs an original clock signal pulse when the output value of the latch circuitry 336a is 1 to generate the desired clock signal.

The desired clock signal has a desired clock frequency $F_{des}$ corresponding to $F_{orig} \cdot N/2^M$. With M being fixed by the size of the accumulator, the clock gating control value that will produce a desired clock frequency from a known original clock frequency can be determined as $F_{des} \cdot 2^M/F_{orig}$. For example given an 8 bit accumulator circuitry 332, when $F_{des}=F_{orig}$ then N is 256 ($2^8$). This means that with every cycle of the original clock, the accumulator circuitry adds 0x100 (N) to 0x00 (contents of register circuitry 334) and the output of the accumulator is 0x100. Since the MSB of the accumulator content is 1 on every original clock cycle, the gate circuitry will pass every pulse of the original clock signal. With the same 8 bit accumulator circuitry 332, when $F_{des}=\frac{1}{2} F_{orig}$ then N is 128 (0x80). This means that with every even cycle of the original clock, the accumulator circuitry adds 0x80 (N) to 0x00 (contents of register circuitry 334) and the output of the accumulator is 0x80 meaning that the gate circuitry 334 does not pass an original clock signal pulse. With odd even cycle of the original clock, the accumulator circuitry adds 0x80 (N) to 0x80 (contents of register circuitry 334) and the output of the accumulator is 0x100 meaning that the gate circuitry 334 does pass an original clock signal pulse. Since the MSB is 1 on every other original clock signal cycle, the gate circuitry 334 will pass every other pulse of the original clock signal.

With the illustrated clock gating circuitry 330, the desired frequency granularity is very fine. For example, with M=7, +/−1% adjustment of the original clock frequency can be achieved. Also, the clock pulses in the desired clock signal are evenly enabled such that, for example, when M=7 and N=96, 75% of the clock frequency can be achieved.

Figure 4:
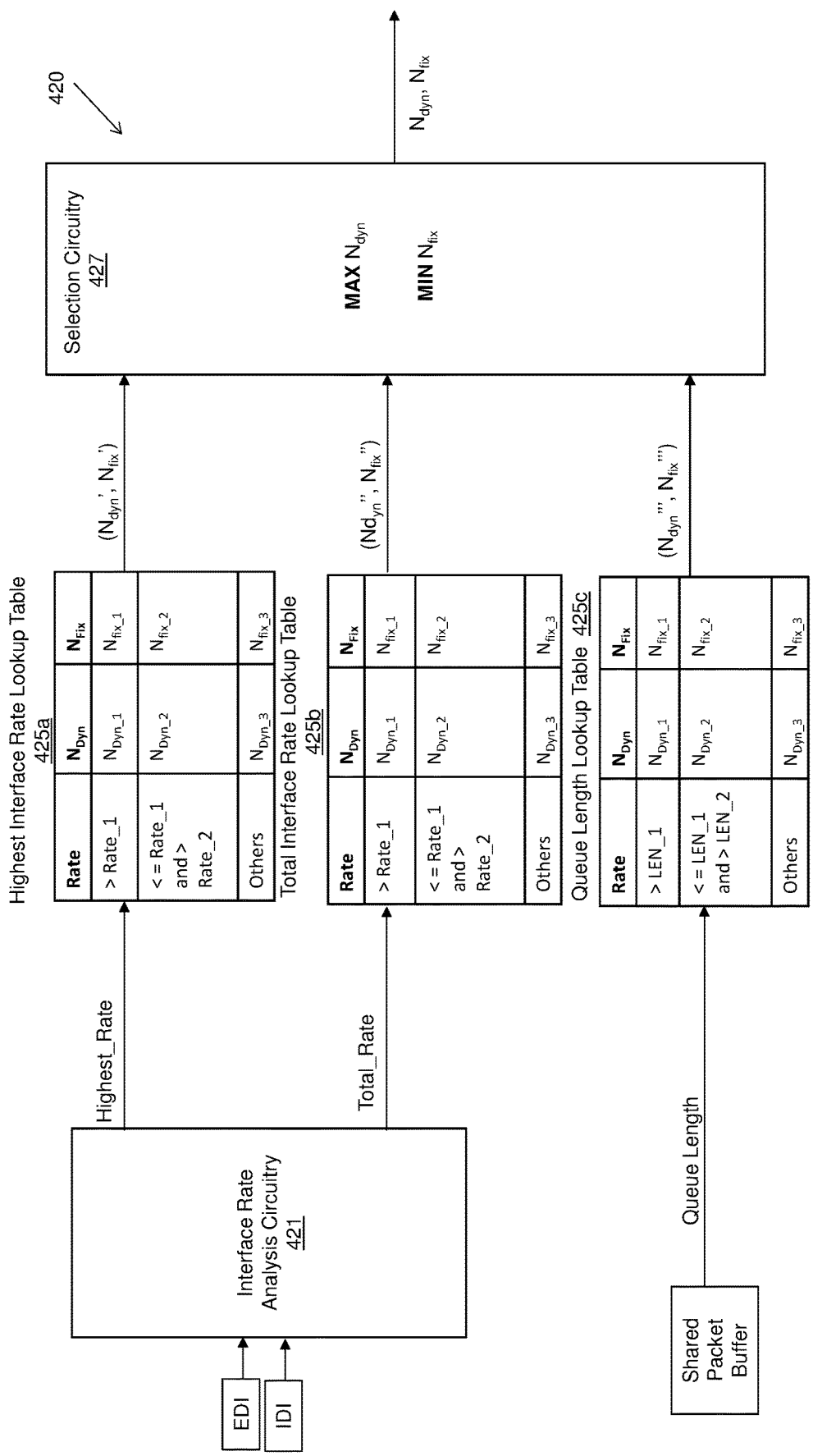
FIG. 4 illustrates an exemplary scaling circuitry for use in generating the dynamic clock signal in accordance with various aspects described.

FIG. 4 illustrates an exemplary scaling control circuitry 420 that generates the dynamic clock gating control value $N_{dyn}$ and the fixed clock gating control circuitry $N_{fix}$. The scaling control circuitry includes an interface rate analysis circuitry 421 that receives performance indicator values corresponding to an interface rate from the ingress data interface (IDI) and the egress data interface (EDI) (see FIG. 2). The interface rate analysis circuitry 421 finds the highest interface rate (Highest_Rate) from all the active links between the network processing system and external devices. For example, the interface rate for each link may be the link speed obtained via an auto negotiation process or an auto polling process. The activity status of each link may be indicated by RX_DV (Receive Data Valid) signals from a GMII/MII ingress data interface, RXC (Receive Control) signals from an XGMI ingress data interface, TX_EN (Transmit Enable) signals from a GMII/MII egress data interface, and/or TXC (Transmit Control) signals from an XGMII egress data interface which are analyzed by the interface rate analysis circuitry 421 to identify the highest interface rate.

The scaling control circuitry 420 includes a highest interface rate lookup table 425a that maps a dynamic clock gating control value $N_{dyn}'$ and a fixed clock gating control value $N_{fix}'$ to ranges of values for the highest interface rate determined by the interface rate analysis circuitry 421. In the lookup table 425a, there are multiple entries. The highest interface rate is compared with the rate range defined in each entry, once match is found, then the dynamic clock gating control value $N_{dyn}'$ and the fixed clock gating control value $N_{fix}'$ for the match entry are selected.

The interface rate analysis circuitry 421 also tabulates the total interface rate (Total_Rate) from all the active links. For example, the interface rate for each link may be the link speed obtained via an auto negotiation process or an auto polling process. The activity status of each link may be indicated by RX_DV (Receive Data Valid) signals from a GMII/MII ingress data interface, RXC (Receive Control) signals from an XGMI ingress data interface, TX_EN (Transmit Enable) signals from a GMII/MII egress data interface, and/or TXC (Transmit Control) signals from an XGMII egress data interface which are combined by the interface rate analysis circuitry to calculate the total interface rate. The scaling control circuitry 420 includes a total interface rate lookup table 425b that maps a dynamic clock gating control value $N_{dyn}''$ and a fixed clock gating control value $N_{fix}''$ to ranges of values for the total interface rate determined by the interface rate analysis circuitry 421. In the lookup table 425b, there are multiple entries. The total interface rate is compared with the range defined in each entry, once match is found, then the dynamic clock gating control value $N_{dyn}''$ and the fixed clock gating control value $N_{fix}''$ for the match entry are selected.

The scaling control circuitry 420 includes a queue length lookup table 425c that maps a dynamic clock gating control value $N_{dyn}'''$ and a fixed clock gating control value $N_{fix}'''$ to ranges of values a queue length for one or more queues in the shared packet buffer (see FIG. 2). In the lookup table 425c, there are multiple entries. The queue length is compared with the range defined in each entry, once match is found, then the dynamic clock gating control value $N_{dyn}'''$ and the fixed clock gating control value $N_{fix}'''$ for the match entry are selected. While only a single queue length is illustrated as a performance indicator in FIG. 4, in some examples, the lengths of multiple queues in the shared packet buffer may each be a performance indicator, the lengths of multiple queues may be combined as a single performance indicator, and/or a length of the longest queue may be a performance indicator.

The scaling control circuitry 420 includes selection circuitry 427 that finds the maximum value of the clock gating control values output by the lookup tables 425a-425c and the minimum value of the fixed clock gating control values output by the lookup tables 425a-425c. The minimum fixed clock gating control value and the maximum dynamic clock gating control value are selected because the fixed clock frequency does not change but the fixed clock signal is derived from the dynamic clock signal which does change. In this manner the product of $N_{dyn}$ and $N_{fix}$ remains the same and the fixed clock signal will have a constant frequency. The selection circuitry 427 outputs the selected dynamic clock gating control value $N_{dyn}$ and fixed clock gating control value $N_{fix}$ to the dynamic clock gating circuitry and the fixed clock gating circuitry (see FIG. 2), respectively.

Figure 5:
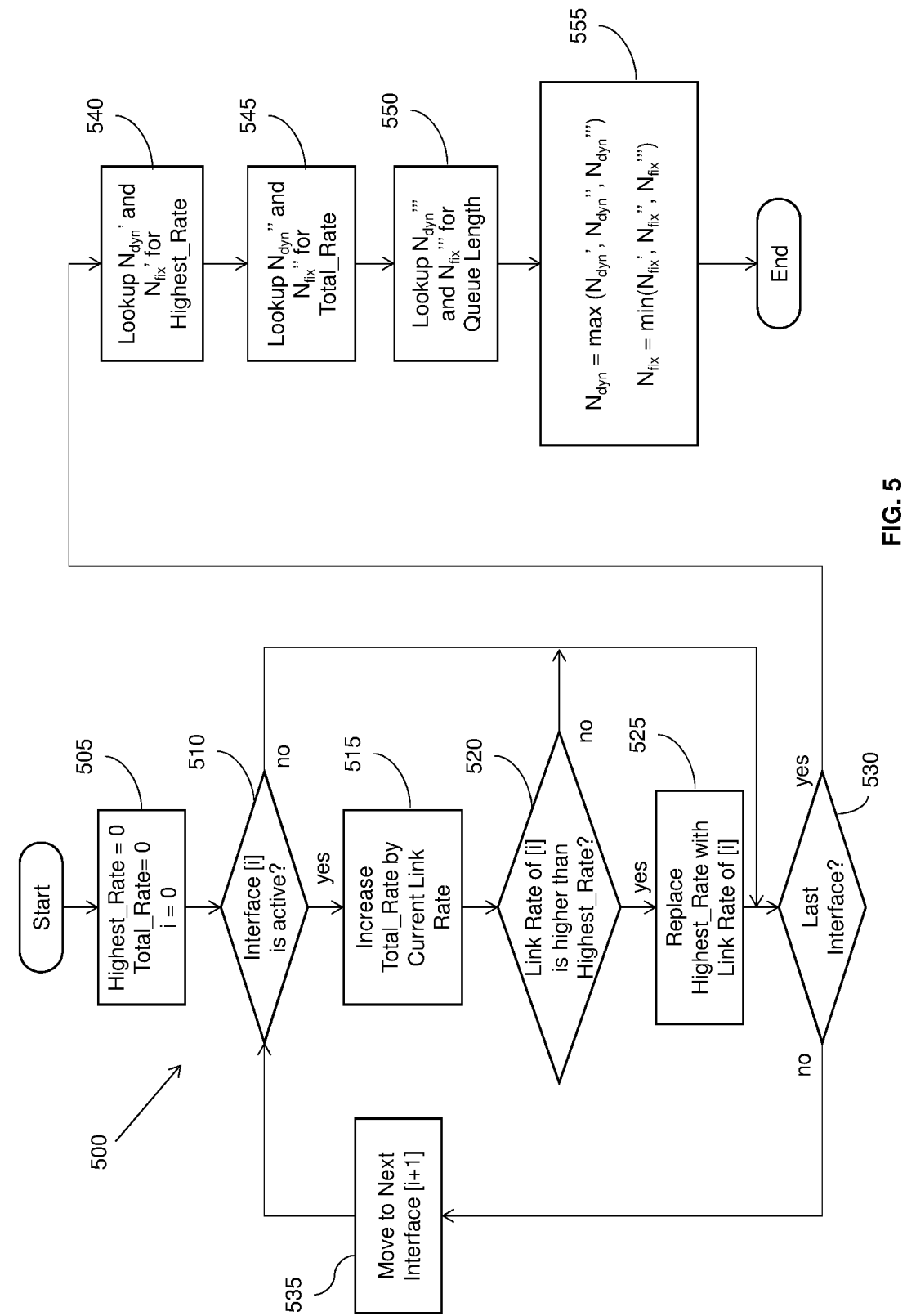
FIG. 5 illustrates an exemplary flow diagram of an exemplary method of adaptively scaling an input clock signal frequency in accordance with various aspects described.

FIG. 5 illustrates a flow diagram outlining an exemplary method 500 for generating a dynamic clock gating control value $N_{dyn}$ and fixed clock gating control value $N_{fix}$ for clock gating circuitries based on performance indicators. The method 500 may be performed by the scaling control circuitry 220 and/or 420 of FIGS. 2 and 4, respectively. The method includes, at 505 initializing a value for Highest_Rate, Total_Rate, and a link identifier [i] to 0. Values for Highest_Rate, Total_Rate, and [i] may be stored in registers. At 510 a determination is made as to whether a next interface [i] is active. If the interface [i] is not active, the method continues to 530 where a check is made as to whether there are any interfaces that have not been analyzed. If at 510 the next interface [i] is active, at 515 the Total_Rate value is increase by the link rate of the interface [i]. At 520 a determination is made as to whether the link rate of interface [i] is higher than the value for Highest_Rate, and if so, at 525 the value for Highest_Rate is replaced with the link rate of interface [i]. At 530 if the last interface has not been analyzed, the method moves to 535 where a next interface [i+1] is identified and 510-530 are performed again.

Once all active interfaces have been analyzed, at 540 $N_{dyn}'$ and $N_{fix}'$ are selected based on the value for Highest_Rate. At 550 $N_{dyn}''$ and $N_{fix}''$ are selected based on the value for Total_Rate. At 550 $N_{dyn}'''$ and $N_{fix}'''$ are selected based on a value for queue length in a shared packet buffer. At 555, the method includes selecting a maximum of $N_{dyn}'$, $N_{dyn}''$, and $N_{dyn}'''$ as dynamic clock gating control value $N_{dyn}$ and a minimum of $N_{fix}'$, $N_{fix}''$, and $N_{fix}'''$ as fixed clock gating control value $N_{fix}$.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for dynamically generating a clock signal for a data processing system according to embodiments and examples described herein.

Example 1 is an adaptive frequency scaling circuitry configured to generate a dynamic clock signal having a dynamic clock signal frequency for a data processing system from an input clock signal having an input clock signal frequency. The adaptive frequency scaling circuitry includes scaling control circuitry and clock gating circuitry. The scaling control circuitry including hardware is configured to receive a performance indicator value indicative of an operating parameter of the data processing system and select a dynamic clock gating control value based at least on the performance indicator value. The clock gating circuitry is configured to receive the dynamic clock gating control value, and in response, selectively gate the input clock signal based on the dynamic clock gating control value to generate the dynamic clock signal.

Example 2 includes the subject matter of example 1, including or omitting optional elements, wherein the scaling control circuitry includes interface rate analysis circuitry and lookup table. The interface rate analysis circuitry is configured to receive signals indicative of interface rates of active links between the data processing system and external devices; identify a highest interface rate; and output the performance indicator value indicative of the highest interface rate. The lookup table is configured to input the performance indicator value and output a dynamic clock gating control value mapped to the highest interface rate.

Example 3 includes the subject matter of example 1, including or omitting optional elements, wherein the scaling control circuitry includes interface rate analysis circuitry and a lookup table. The interface rate analysis circuitry is configured to receive signals indicative of interface rates of active links between the data processing system and external devices; compute a total interface rate based on the interface rates; and output the performance indicator value indicative of the total interface rate. The lookup table is configured to input the performance indicator value and output a dynamic clock gating control value mapped to the total interface rate.

Example 4 includes the subject matter of example 1, including or omitting optional elements, wherein the scaling circuitry further includes a lookup table configured to input a performance indicator value indicative of a length of a queue in a shared packet buffer of the data processing system and output a dynamic clock gating control value mapped to the queue length.

Example 5 includes the subject matter of example 1, including or omitting optional elements, wherein the scaling circuitry includes a plurality of lookup tables and selection circuitry. The plurality of lookup tables input a respective plurality of performance indicator values and output a respective plurality of dynamic clock gating control values. The selection circuitry is configured to select one of the plurality of dynamic clock gating control values and provide the selected dynamic clock gating control value to the clock gating circuitry.

Example 6 includes the subject matter of example 1, including or omitting optional elements, wherein the dynamic clock gating control value is indicative of an integer N and the clock gating circuitry includes: accumulator circuitry having M+1 bits, wherein the accumulator is configured to combine a first input value and a second input value and output M+1 bits corresponding to a sum of the first value and the second value, further wherein the first input value is N; register circuitry configured to store bits M−1 to 0 of the output M+1 bits from the accumulator and provide the stored bits to the accumulator as the second value; and gate circuitry configured to output the dynamic clock signal by passing an input clock signal pulse in response to bit M in the output M+1 bits from the accumulator being 1; and the scaling control circuitry is configured to determine N based at least on a desired frequency and M.

Example 7 includes the subject matter of example 1, including or omitting optional elements, wherein the scaling control circuitry generates the dynamic clock gating signal and a fixed clock gating signal, the clock gating circuitry includes a first clock gating circuitry configured to receive the dynamic clock gating control value, and in response, selectively gate the input clock signal based on the dynamic clock gating control value to generate a dynamic clock signal having a desired dynamic clock frequency. A second clock gating circuitry is configured to receive the fixed clock gating control value, and in response, selectively gate the dynamic clock signal based on the fixed clock gating control value to generate a fixed clock signal having a fixed clock frequency, wherein the fixed clock signal frequency remains constant regardless of the performance indicator value.

Example 8 includes the subject matter of example 7, including or omitting optional elements, wherein the scaling circuitry includes a plurality of lookup tables and selection circuitry. The plurality of lookup tables input a respective plurality of performance indicator values and output a respective plurality of dynamic clock gating control values and a respective plurality of fixed clock gating control values. The selection circuitry configured to select one of the plurality of dynamic clock gating control values; select one of the plurality of fixed clock gating control values, such that the selected fixed clock gating control value, when used to gate the dynamic clock signal, will generate a fixed clock signal having the fixed clock signal frequency; and provide the selected dynamic clock gating control value and the selected fixed clock gating control value to the clock gating circuitry.

Example 9 includes the subject matter of example 1, including or omitting optional elements, wherein the scaling control circuitry further includes trigger circuitry configured to cause the scaling control circuitry to determine a subsequent desired dynamic clock frequency for the data processing system on every xth cycle of the input clock signal, where x is a predetermined integer.

Example 10 is a method, including receiving a performance indicator value indicative of an operating parameter of a data processing system; selecting a dynamic clock gating control value based at least on the performance indicator value; and gating an input clock signal based at least on the dynamic clock gating control value to generate a dynamic clock signal.

Example 11 includes the subject matter of example 10, including or omitting optional elements, wherein selecting a dynamic clock gating control value includes inputting the performance indicator value to a lookup table and selecting an output of the lookup table as the clock gating control value.

Example 12 includes the subject matter of example 10, including or omitting optional elements, further including: selecting a fixed clock gating control value based on the dynamic clock gating control value and a fixed clock frequency; and gating the dynamic clock signal based at least on the fixed clock gating control value to generate a fixed clock signal having the fixed clock frequency.

Example 13 includes the subject matter of example 10, including or omitting optional elements, wherein gating the input clock signal to generate the dynamic clock signal includes, for each cycle of the input clock signal: inputting M+1 bits corresponding to the dynamic clock gating control value to an accumulator having M+1 bits; inputting M bits corresponding to bits M−1:0 of the accumulator at a prior input clock cycle to the accumulator; and passing an input clock signal pulse in response to bit M of the accumulator being 1.

Example 14 includes the subject matter of example 13, including or omitting optional elements, further including determining the dynamic clock gating control value as a product of a desired dynamic clock signal frequency and $2^M$ divided by an input clock frequency of the input clock signal.

Example 15 includes the subject matter of example 10, including or omitting optional elements, further including: receiving a performance indicator value indicative of a plurality of operating parameters of a data processing system; determining a plurality of dynamic clock gating control values, wherein each of the determined dynamic clock gating control values in the plurality of dynamic clock gating control values is based a different one of the plurality performance indicator values; selecting a maximum dynamic clock gating control value from amongst the determined dynamic clock gating control values; and gating an input clock signal based at least on the maximum dynamic clock gating control value to generate the dynamic clock signal.

Example 16 includes the subject matter of example 10, including or omitting optional elements, wherein the performance indicator value is indicative of one or more of a highest interface rate amongst active links between the data processing system and external devices, a highest interface rate amongst active links between the data processing system and the external devices, and a queue length in a shared packet buffer in the data processing system.

Example 17 is a clock gating circuitry configured to gate an original clock signal having an original clock frequency to generate a desired clock signal having a desired clock frequency based on a clock gating control value N. The clock gating circuitry includes accumulator circuitry having M+1 bits, wherein the accumulator is configured to combine a first input value and a second input value and output M+1 bits corresponding to a sum of the first value and the second value, further wherein the first input value is N; register circuitry configured to store bits M−1 to 0 of the output M+1 bits from the accumulator and provide the stored bits to the accumulator as the second value; and gate circuitry configured to output the desired clock signal by passing an original clock signal pulse in response to bit M in the output M+1 bits from the accumulator being 1.

Example 18 includes the subject matter of example 17, including or omitting optional elements, wherein the original clock signal is a clock signal that is output by another clock gating circuitry.

Example 19 is a method, including, until all active interfaces have been analyzed: identifying an active interface between a data processing system and an external device; increasing a total rate value by a link rate of the active interface; and replacing a highest rate value with the link rate when the link rate is higher than the highest rate value; selecting a first dynamic clock gating control value based on the total rate value; selecting a second dynamic clock gating control value based on the highest rate value; selecting a third dynamic clock gating control value based on a queue length value; and providing, to a clock gating circuitry, a maximum of the first dynamic clock gating control value, the second dynamic clock gating control value, and the third dynamic clock gating control value as a dynamic clock gating control value, wherein the clock gating circuitry generates a dynamic clock signal from an input clock signal based at least on the maximum dynamic clock gating control value.

Example 20 includes the subject matter of example 19, including or omitting optional elements, further including: selecting a first fixed clock gating control value based on the total rate value; selecting a second fixed clock gating control value based on the highest rate value; selecting a third fixed clock gating control value based on a queue length value; and providing, to a second clock gating circuitry, a minimum of the first fixed clock gating control value, the second fixed clock gating control value, and the third fixed clock gating control value as a fixed clock gating control value, wherein a second clock gating circuitry generates a fixed clock signal from the dynamic clock signal based at least on the minimum fixed clock gating control value.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. Adaptive frequency scaling circuitry configured to generate a dynamic clock signal having a dynamic clock signal frequency for a data processing system from an input clock signal having an input clock signal frequency, the adaptive frequency scaling circuitry comprising:
   scaling control circuitry comprising hardware configured to:
      receive a performance indicator value indicative of an operating parameter of the data processing system; and
      select a dynamic clock gating control value based at least on the performance indicator value, wherein the scaling control circuitry comprises a lookup table configured to input the performance indicator value and output a dynamic clock gating control value mapped to the highest interface rate;
   clock gating circuitry configured to:
      receive the dynamic clock gating control value; and
      in response, selectively gate the input clock signal based on the dynamic clock gating control value to generate the dynamic clock signal.

2. The adaptive frequency scaling circuitry of claim 1, wherein the scaling control circuitry comprises:
   interface rate analysis circuitry configured to:
      receive signals indicative of interface rates of active links between the data processing system and external devices;
      identify a highest interface rate; and
      output the performance indicator value indicative of the highest interface rate.

3. The adaptive frequency scaling circuitry of claim 1, wherein the scaling control circuitry comprises:
   interface rate analysis circuitry configured to:
      receive signals indicative of interface rates of active links between the data processing system and external devices;
      compute a total interface rate based on the interface rates; and
      output the performance indicator value indicative of the total interface rate; and
   a lookup table configured to input the performance indicator value and output a dynamic clock gating control value mapped to the total interface rate.

4. The adaptive frequency scaling circuitry of claim 1, wherein the scaling circuitry further comprises a lookup table configured to input a performance indicator value indicative of a length of a queue in a shared packet buffer of the data processing system and output a dynamic clock gating control value mapped to the queue length.

5. The adaptive frequency scaling circuitry of claim 1, wherein the scaling circuitry comprises:
   a plurality of lookup tables that input a respective plurality of performance indicator values and output a respective plurality of dynamic clock gating control values; and
   selection circuitry configured to:
      select one of the plurality of dynamic clock gating control values; and
      provide the selected dynamic clock gating control value to the clock gating circuitry.

6. The adaptive frequency scaling circuitry of claim 1, wherein:

the dynamic clock gating control value is indicative of an integer N:
the clock gating circuitry comprises:
  accumulator circuitry having M+1 bits, wherein the accumulator is configured to combine a first input value and a second input value and output M+1 bits corresponding to a sum of the first value and the second value, further wherein the first input value is N;
  register circuitry configured to store bits M−1 to 0 of the output M+1 bits from the accumulator and provide the stored bits to the accumulator as the second value; and
  gate circuitry configured to output the dynamic clock signal by passing an input clock signal pulse in response to bit M in the output M+1 bits from the accumulator being 1; and
the scaling control circuitry is configured to determine N based at least on a desired frequency and M.

7. The adaptive frequency scaling circuitry of claim 1, wherein:
the scaling control circuitry generates the dynamic clock gating signal and a fixed clock gating signal;
the clock gating circuitry comprises:
  a first clock gating circuitry configured to:
    receive the dynamic clock gating control value; and
    in response, selectively gate the input clock signal based on the dynamic clock gating control value to generate a dynamic clock signal having a desired dynamic clock frequency; and
  a second clock gating circuitry configured to:
    receive the fixed clock gating control value; and
    in response, selectively gate the dynamic clock signal based on the fixed clock gating control value to generate a fixed clock signal having a fixed clock frequency, wherein the fixed clock signal frequency remains constant regardless of the performance indicator value.

8. The adaptive frequency scaling circuitry of claim 7, wherein the scaling circuitry comprises:
a plurality of lookup tables that input a respective plurality of performance indicator values and output a respective plurality of dynamic clock gating control values and a respective plurality of fixed clock gating control values; and
selection circuitry configured to:
  select one of the plurality of dynamic clock gating control values;
  select one of the plurality of fixed clock gating control values, such that the selected fixed clock gating control value, when used to gate the dynamic clock signal, will generate a fixed clock signal having the fixed clock signal frequency; and
  provide the selected dynamic clock gating control value and the selected fixed clock gating control value to the clock gating circuitry.

9. The adaptive frequency scaling circuitry of claim 1, wherein the scaling control circuitry further comprises trigger circuitry configured to cause the scaling control circuitry to determine a subsequent desired dynamic clock frequency for the data processing system on every xth cycle of the input clock signal, where x is a predetermined integer.

10. A method, comprising:
receiving a performance indicator value indicative of an operating parameter of a data processing system;
selecting a dynamic clock gating control value based at least on the performance indicator value, wherein selecting a dynamic clock gating control value comprises inputting the performance indicator value to a lookup table and selecting an output of the lookup table as the clock gating control value; and
gating an input clock signal based at least on the dynamic clock gating control value to generate a dynamic clock signal.

11. The method of claim 10, further comprising:
selecting a fixed clock gating control value based on the dynamic clock gating control value and a fixed clock frequency; and
gating the dynamic clock signal based at least on the fixed clock gating control value to generate a fixed clock signal having the fixed clock frequency.

12. The method of claim 10, wherein gating the input clock signal to generate the dynamic clock signal comprises, for each cycle of the input clock signal:
inputting M+1 bits corresponding to the dynamic clock gating control value to an accumulator having M+1 bits;
inputting M bits corresponding to bits M−1:0 of the accumulator at a prior input clock cycle to the accumulator; and
passing an input clock signal pulse in response to bit M of the accumulator being 1.

13. The method of claim 12, further comprising determining the dynamic clock gating control value as a product of a desired dynamic clock signal frequency and 2M divided by an input clock frequency of the input clock signal.

14. The method of claim 10, further comprising:
receiving a performance indicator value indicative of a plurality of operating parameters of a data processing system;
determining a plurality of dynamic clock gating control values, wherein each of the determined dynamic clock gating control values in the plurality of dynamic clock gating control values is based a different one of the plurality performance indicator values;
selecting a maximum dynamic clock gating control value from amongst the determined dynamic clock gating control values; and
gating an input clock signal based at least on the maximum dynamic clock gating control value to generate the dynamic clock signal.

15. The method of claim 10 wherein the performance indicator value is indicative of one or more of a highest interface rate amongst active links between the data processing system and external devices, a highest interface rate amongst active links between the data processing system and the external devices, and a queue length in a shared packet buffer in the data processing system.

16. A method, comprising:
until all active interfaces have been analyzed:
  identifying an active interface between a data processing system and an external device;
  increasing a total rate value by a link rate of the active interface; and
  replacing a highest rate value with the link rate when the link rate is higher than the highest rate value;
selecting a first dynamic clock gating control value based on the total rate value;
selecting a second dynamic clock gating control value based on the highest rate value;
selecting a third dynamic clock gating control value based on a queue length value; and providing, to a clock gating circuitry, a maximum of the first dynamic clock gating control value, the second dynamic clock gating control value, and the third dynamic clock gating control value as a dynamic clock gating control value, wherein the clock gating circuitry generates a dynamic clock signal from an input clock signal based at least on the maximum dynamic clock gating control value.

17. The method of claim 16, further comprising:
selecting a first fixed clock gating control value based on the total rate value;
selecting a second fixed clock gating control value based on the highest rate value;
selecting a third fixed clock gating control value based on a queue length value; and
providing, to a second clock gating circuitry, a minimum of the first fixed clock gating control value, the second fixed clock gating control value, and the third fixed clock gating control value as a fixed clock gating control value, wherein a second clock gating circuitry generates a fixed clock signal from the dynamic clock signal based at least on the minimum fixed clock gating control value.

\* \* \* \* \*